United States Patent [19]

Hung et al.

[11] Patent Number: 4,908,348
[45] Date of Patent: Mar. 13, 1990

[54] BARRIER LAYER ARRANGEMENT FOR CONDUCTIVE LAYERS ON SILICON SUBSTRATES

[75] Inventors: Liang-Sun Hung; John A. Agostinelli, both of Rochester, N.Y.

[73] Assignee: Eastman Kodak Company, Rochester, N.Y.

[21] Appl. No.: 153,699

[22] Filed: Feb. 8, 1988

[51] Int. Cl.$^4$ .............................................. B32B 9/00
[52] U.S. Cl. ..................................... 505/1; 505/701; 505/702; 505/704; 428/209; 428/332; 428/333; 428/334; 428/446; 428/448; 428/457; 428/469; 428/901; 428/341; 428/472; 174/256; 361/397
[58] Field of Search .................... 505/1, 701, 702, 704; 428/930, 209, 332, 333, 334, 446, 448, 457, 469, 901, 341, 472; 174/68.5; 361/397

[56] References Cited

PUBLICATIONS

Y-Ba-Cu-O Superconductor Film, Gupta et al., Appl. Phys. Lett., vol. 52 (23), 6/88, 1987-88.
J. G. Bednorz and K. A. Müller, "Possible High $T_c$ Superconductivity in the Ba-La-Cu-O System", Z. Phys. B. Condensed Matter, vol. 64, pp. 189-193 (1986).
C. W. Chu, P. H. Hor, R. L. Meng, L. Gao, Z. J Huang, and Y. Q. Wang, "Evidence for Superconductivity above 40 K in the La-Ba-Cu-O Compound System", Physical Review Letters, vol. 53, No. 4, pp. 405-407, Jan. 1987.
C. W. Chu, P. H. Hor, R. L. Meng, L. Gao, and Z. J. Huang, "Superconductivity at 52.5 K in the Lanthanum-Barium-Copper-Oxide System", Science Reports, vol. 235, pp. 567-569, Jan. 1987.
R. J. Cava, R. B. vanDover, B. Batlog, and E. A. Rietman, "Bulk Superconductivity at 36 K in La$_{1.8}$Sr$_{0.2}$CuO$_4$", Physical Review Letters, vol. 58, No. 4, pp. 408-410, Jan. 1987.
J. M. Tarascon, L. H. Greene, W. R. McKinnon, G. W. Hull, and T. H. Geballe, "Superconductivity at 40 K in the Oxygen-Defect Perovskites La$_{2-x}$Sr$_x$CuO$_{4-y}$", Science Reports, vol. 235, pp. 1373-1376, Mar. 13, 1987.
M. K. Wu, J. R. Ashburn, C. J. Torng, P. H. Hor, R. L. Meng, L. Gao, Z. J. Huang, Y. Q. Wang, and C. W. Chu, "Superconductivity at 93 K in a New Mixed--Phase Y-Ba-Cu-O Compound System at Ambient Pressure", Physical Review Letters, vol. 58, No. 9, pp. 908-910, Mar. 2, 1987.
C. E. Rice et al., "Preparation of Superconducting Thin Films of Ba$_2$YCu$_3$O$_7$ by a Novel Spin-On Pyrolysis Technique," Appl. Phys. Left., vol. 51, No. 22, pp. 1842-2844 (1987).
A. H. Hamdi et al., "Formation of Thin-Film High Tc Superconductors by Metalorganic Deposition," Appl. Phys. Lett., vol. 51, No. 25, pp. 2152-2154 (1987).
M. E. Gross et al., "Versatile New Metalorganic Process for Preparing Superconducting Thin Films," Appl. Phys. Lett., vol. 52, No. 2, pp. 160-162 (1988).
T. Kumagai et al., "Preparation of Superconducting YBa$_2$Cu$_3$O$_{7-d}$ Thin Films by the Dipping-Pyrolysis Process Using Organic Acid Salts," Chemistry Letters, pp. 1645-1646 (1987).
H. Nasu et al., "Superconducting Y-BA-Cu-O Films with Tc>70 K Prepared by Thermal Decomposition Technique of Y-, Ba-, and Cu-2ethylhezanoates", Chemistry Letters, pp. 2403-2404 (1987).

Primary Examiner—Ellis P. Robinson
Assistant Examiner—P. J. Ryan
Attorney, Agent, or Firm—Carl O. Thomas

[57] ABSTRACT

A barrier layer triad intended to protect a silicon substrate and an overlying conductive layer from mutual contamination is disclosed as well as a process for its preparation. The barrier layer triad is comprised of a first triad layer located adjacent the silicon substrate consisting essentially of silica, a third triad layer remote from the silicon substrate consisting essentially of at least one Group 4 heavy metal oxide, and a second triad layer interposed between the first and third triad layers consisting essentially of a mixture of silica and at least one Group 4 heavy metal oxide.

17 Claims, 3 Drawing Sheets

BARRIER LAYER ARRANGEMENT FOR CONDUCTIVE LAYERS ON SILICON SUBSTRATES

FIELD OF THE INVENTION

The present invention relates to electrical circuit elements and to processes for their preparation.

BACKGROUND OF THE INVENTION

The term "superconductivity" is applied to the phenomenon of immeasurably low electrical resistance exhibited by materials. Until recently superconductivity had been reproducibly demonstrated only at temperature near absolute zero. As a material capable of exhibiting superconductivity is cooled, a temperature is reached at which resistivity decreases (conductivity increases) markedly as a function of further decreases in temperature. This is referred to as the superconducting transition temperature or, in the context of superconductivity investigations, simply as the critical temperature ($T_c$). $T_c$ provides a conveniently indentified and generally accepted reference point for marking the onset of superconductivity and providing temperature rankings of superconductivity in differing materials.

It has been recently recognized that certain rare earth alkaline earth copper oxides exhibit superconducting transition temperatures well in excess of the highest previously known metal oxide $T_c$, a 13.7° 1 K. $T_c$ reported for lithium titanium oxide. These rare earth alkaline earth copper oxides also exhibit superconducting transition temperatures well in excess of the highest previously accepted reproducible $T_c$, 23.3° K. for the metal $Nb_3Ge$.

Recent discoveries of higher superconducting transition temperatures in rare earth alkaline earth copper oxides are reported in the following publications:

P-1: J. G. Bednorz and K. A. Müller, "Possible High $T_c$ Superconductivity in the Ba-La-Cu-O System", *Z. Phys. B.—Condensed Matter*, Vol. 64, pp. 189–193 (1986) revealed that polycrystalline compositions of the formula $Ba_xLa_{5-x}Cu_5O_{5(3-y)}$, where $x=1$ and $0.75 \ y>0$ exhibited superconducting transition temperatures in the 30° K. range.

P-2: C. W. Chu. P. H. Hor, R. L. Meng, L. Gao, Z. J. Huang, and Y. Q. Wang, "Evidence for Superconductivity above 40° K. in the La-Ba-Cu-O Compound System", *Physical Review Letters*, Vol. 53, No. 4, pp. 405–407, Jan. 1987, reported increasing $T_c$ to 40.2° K. at a pressure of 13 kbar. At the end of this article it is stated that M. K. Wu increased $T_c$ to 42° K. at ambient pressure by replacing Ba with Sr.

P-3: C. W. Chu, P. H. Hor, R. L. Meng, L. Gao, and Z. J. Huang, "Superconductivity at 52.5° K. in the Lanthanum-Barium-Copper-Oxide System", *Science Reports*, Vol. 235, pp. 567–569, Jan. 1987, a $T_c$ of 52.5° K. for $(La_{0.9}Ba_{0.1})_2CuO_{4-y}$ at high pressures.

P-4: R. J. Cava, R. B. vanDover, B. Batlog, and E. A. Rietman, "Bulk Superconductivity at 36° K. in $La_{1.8}Sr_{0.2}CuO_4$", *Physical Review Letters*, Vol. 58, No. 4, pp. 408–410, Jan. 1987, reported resistivity and magnetic susceptibility measurements in $La_{2-x}Sr_xCuO_4$, with a $T_c$ at 36.2° K. when $x=0.2$.

P-5: J. M. Tarascon, L. H. Greene, W. R. Mckinnon, G. W. Hull, and T. H. Geballe, "Superconductivity at 40° K. in the Oxygen-Defect Pervskites $La_{2-x}Sr_xCuO_{4-y}$", *Science Reports*, Vol. 235, pp. 1373–1376, Mar. 13, 1987, reported title compounds ($0.05 \leq x \leq 1.1$) with a maximum $T_c$ of 39.3° K.

P-6: M. K. Wu, J. R. Ashburn, C. J. Torng, P. H. Hor, R. L. Meng, L. Gao, Z. J. Huang, Y. Q. Wang, and C. W. Chu, "Superconductivity at 93° K. in a New Mixed-Phase Y-Ba-Cu-O Compound System at ambient Pressure", *Physical Review Letters*, Vol. 58, No. 9, pp. 908–910, Mar. 2, 1987, reported stable and reproducible superconducting transition temperatures between 80 and 93° K. at ambient pressures for materials generically represented by the formula $(L_{1-x}M_x)_aA_bD_y$, where $L=Y$, $M=Ba$, $A=Cu$, $D=O$, $x=0.4$, $a=2$, $b=1$, and $y \geq 4$.

The experimental details provided in publications P-1 through P-6 indicate that the rare earth alkaline earth copper oxides prepared and investigated were in the form of cylindrical pellets produced by forming an intermediate oxide by firing, grinding or otherwise pulverizing the intermediate oxide, compressing the particulate intermediate oxide formed into cylindrical pellets, and then sintering to produce a polycrystalline pellet. While cylindrical pellets are convenient articles for cooling and applying resistance measuring electrodes, both the pellets and their preparation procedure offer significant disadvantages to producing useful electrically conductive articles, particularly articles which exhibit high conductivity below ambient temperature—e.g., superconducting articles. First, the step of grinding or pulverizing the intermediate oxide on a commercial scale prior to sintering is both time and energy consuming and inherently susceptible to material degradation due to physical stress on the material itself, erosion of grinding machinery metal, and handling. Second, electrically conductive articles rarely take the form the pellets. Electrically conductive articles commonly include either thin or thick films forming conductive pathways on substrates, such as insulative and semiconductive substrates—e.g., printed and integrated circuits.

CROSS-REFERENCE TO RELATED FILING

Mir, Agostinelli, Peterson, Paz-Pujalt, Higberg, and Rajeswaran U.S. Ser. No. 046,593, filed May, 4, 1987, titled CONDUCTIVE ARTICLES AND PROCESSES FOR THEIR PREPARATION, commonly assigned, discloses articles in which an electrically conductive layer on a substrate exhibits a superconducting transition temperature in excess of 30° K. Conductive layers are disclosed comprised of a crystalline rare earth alkaline earth copper oxide. Processes of preparing these articles are disclosed in which a mixed metal oxide precursor is coated in solution and subsequently heated to its thermal decomposition temperature to create an amorphous mixed metal oxide layer. The amorphous layer is then heated to its crystallization temperature. Thin electrically conductive films are formed.

Strom, Carnall, Ferranti, and Mir U.S. Ser. No. 068,391, filed Jul. 1, 1987, titled CONDUCTIVE THICK FILMS AND PROCESS FOR FILM PREPARATION, commonly assigned, discloses circuit elements comprising an insulative substrate and means for providing a conductive path betwen at least two locations on the substrate including a thick film conductor which is comprised of a crystalline rare earth alkaline earth copper oxide layer having a thickness of at least 5 μm. The thick film conductor is formed by coating a conductor precursor on the insulative substrate and converting the conductor precursor to an electrical conductor. The conductor precursor is coated in the form of particles of metal-ligand compounds of each of rare earth, alkaline earth, and copper containing at least one thermally volatilizable ligand. The coated conductor precursor is heated in the presence of oxygen to form an intermediate coating on the substrate. The intermediate coating is converted to a crystalline rare earth alkaline earth copper oxide electrical conductor.

In attempting to form a electrically conductive, particularly superconductive, rare earth alkaline earth copper oxide layer on a substrate a difficulty that has been encountered is a migration of substrate and copper containing oxide layer elements upon heating to the high temperatures required for crystallization, typically in the range of from 900° to 1100° C. Migration alters the composition of the copper containing oxide layer and interface with formation of the crystal structures required for best conductivity results. While the difficulty of substrate contamination of the copper containing oxide layer can be ameliorated to a degree by increasing its thickness, the choice of substrates which produce better results in terms of copper containing oxide layer conductivity has remained restricted, particularly in forming thin (21 5μm) film thicknesses.

Angostinelli, Mir, Paz-Pujalt, Lelental, and Nicholas U.S. Ser. No. 85,047, filed Aug. 13, 1987, titled BARRIER LAYER CONTAINING CONDUCTIVE ARTICLES, discloses a circuit element comprised of a substrate and an electrically conductive layer located on the substrate. The circuit element is characterized in that the electrically conductive layer is comprised of a crystalline rare earch alkaline earth copper oxide, the substrate is formed of a material which increases the electrical resistance of the conductive layer when in contact with the rare earth alkaline earth copper oxide during its crystallization to an electrically conductive form, and a barrier layer is interposed between the electrically conductive layer and the substrate. The barrier layer contains a metal, in its elemental form or in the form of an oxide or silicide, chosen from the group consisting of magnesium, a group IVA metal, or a platinum group metal.

Agostinelli et al additionally discloses a process of forming a circuit element including coating a conductor precursor on a substrate and converting the conductor precursor to an electrical conductor. The process is characterized by the steps of chosing, as the conductor precursor, metal-ligand compounds of each of rare earth, alkaline earth, and copper containing at least one thermally volatilizable ligand; heating the precursor metal-ligand compounds in the presence of oxygen to produce a crystalline rare earth alkaline earth copper oxide electrically conductive layer; choosing as the substrate a material which increases the electrical resistance of the conductive layer when in contact with the rare earth alkaline earth copper oxide during its crystallization to an electrically conductive form; and prior to coating the conductor precursor on the support forming on the substrate a barrier layer. The barrier layer contains a metal, in its elemental form or in the form of an oxide or silicide, chosen from the group consisting of magnesium, a group IVA metal, or a platinum group metal.

SUMMARY OF THE INVENTION

The present invention is directed to protecting silicon substrates and conductive layers coated thereon from mutual contamination. Specifically, the invention is directed to improving the electrical conduction characteristics of a rare earth alkaline earth copper oxide layer when coated on a silicon substrate while at the same time protecting the silicon substrate from copper contamination. This objective is achieved by a particular arrangement of layers interposed between the rare earth alkaline earth copper oxide layer and the silicon substrate and by a process for producing this layer arrangement. The invention permits the formation on silicon substrates of rare earth alkaine earth copper oxide layers which exhibit higher critical temperatures and superconductivity at higher temperatures. The invention further permits the rare earth alkaline earth copper oxide conductive layer to carry higher current densities in its superconducting state.

In one aspect this invention is directed to a circuit element comprised of a silicon substrate and a conductive layer located on the substrate. The conductive layer consists essentially of a rare earth alkaline earth copper oxide. A barrier layer triad is interposed between the silicon substrate and the conductive layer comprised of a first triad layer located adjacent the silicon substrate consisting essentially of silicia, a third triad layer remote from the silicon substrate consisting essentially of at least one Group 4 heavy metal oxide, and a second triad layer interposed between the first and third triad layers consisting essentially of a mixture of silica and at least one Group 4 heavy metal oxide.

In another aspect of the invention, the circuit element is further characterized in that at least 45 percent by volume of the rare earth alkaline earth copper oxide of the conductive layer is in an $R_1A_2C_3$ crystalline phase and silver is located at the interface of the third layer and the conductive layer in an amount sufficient to direct crystal orientation of the $R_1A_2C_3$ crystalline phase.

In a additional aspect, the invention is directed to a process of producing on a silicon substrate a barrier layer triad comprising (1) forming a silica layer of at least 200 Å in thickness on the silicon substrate, (2) depositing on the silica a layer having a thickness in the range of from 1000 to 5000 Å of at least one Group 4 heavy metal, and (3) heating the layers in the absence of a reactive atmosphere sufficiently to permit oxygen migration from the silica layer, thereby forming a barrier layer triad consisting of a first triad layer located adjacent the silicon substrate consisting essentially of silica, a third triad layer remote from the silicon substrate consisting essentially of at least one Group 4 heavy metal oxide, and a second triad layer interposed between the first and third triad layers consisting essentially of at least one Group 4 heavy metal silicide.

In an additional aspect of the invention, the process described above is further characterized in that the barrier layer triad is subsequently heated in the presence of oxygen to convert the second triad layer to a mixture of silica and at least one Group 4 heavy metal oxide.

BRIEF DESCRIPTION OF THE DRAWINGS

These and other advantages of the invention can be better appreciated by reference to the following detailed description of preferred embodiments considered in conjunction with the drawings, in which.

Description Preferred Embodiments

Figure 2:
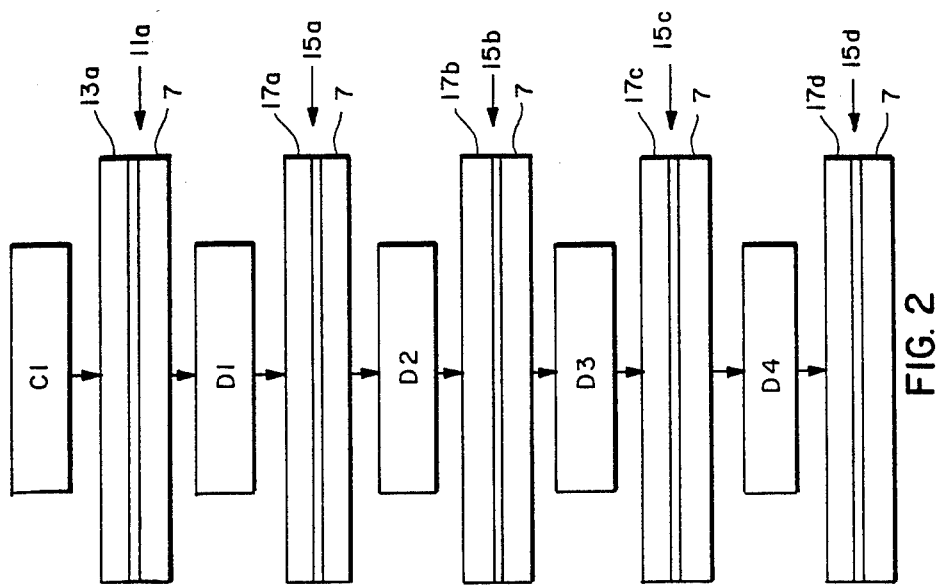
FIG. 2 is a schematic diagram of a portion of a preferred thin film process.

The present invention has as its purpose to make available electrical circuit elements containing a silicon substrate supporting a conductive rare earth alkaline earth copper oxide layer. The silicon substrate and the rare earth alkaline earth copper oxide layer are protected from mutual contamination by an interposed barrier layer triad.

The silicon substrates contemplated by this invention include any conventional monocrystalline or polycrystalline substrate. Amorphours silicon can also be employed as a substrate, but it will be converted to a polycrystalline from by the temperatures required for forming the rare earth alkaline earth copper oxide conductive layer thereon. It is specficially contemplated to employ as substrates silicon semiconductive elements, particularly silicon integrated circuits.

To protect the silicon substrate from contamination by the rare earth alkaline earth copper oxide forming the overlying conductive layer, particularly to protect against copper contamination, and to protect the conductive layer from silicon contamination which will reduce its desirable electrical conduction properties, particularly silicon contamination which will lower the Tc of the conductive layer or decrease the maximum temperature at which superconductivity is observed, a barrier layer triad is formed on the silicon substrate surface before the conductive layer is formed.

The first step of the process is to form on the silicon substrate a silica layer of at least 2000 Å in thickness. The silica layer is preferably at least 5000 Å thickness. Any convenient thickness of the silica layer can be formed beyond the minium thickness required. Silica layer formation on silicon substrates can be achieved by any convenient conventional means and forms no part of this invention. The silica layer is in most instances conveniently formed by oxidation of the silicon substrate surface to form a grown silicon oxide layer. Alternatively, the silica layer can be deposited.

Following formation of the silica layer at least one Group 4 heavy metal is deposited on the silica layer. The term "Grou 4 heavy metal" is herein employed to indicate the elements zirconium and hafnium, which occupy Group 4 of the periodic table of elements, as adopted by the American Chemical Society. Group 4 elements are also referred to as Group IVA elements using the IUPAC notation system for the periodic table of elements. The Group 4 heavy metal or metals are deposited to form a layer which is from about 1000 to 5000 Å in thickness. At lower layer thickness barrier effectiveness can be degraded by inadequate Group 4 heavy métal while at greater layer thickness physical stresses in the layer are increased, which can lead to physical defects. The Group 4 heavy metal layer can be deposited on the silica layer by any convenient conventional technique compatible with achieving the desired layer thicknesses. Techniques such as vacuum vapor depostion, chemical vapor deposition, metal organic vapor deposition, and sputtering are adequate to achieved the desired layer arrangement.

The next step is to convert the silica and Group 4 heavy metal layers into a barrier layer triad. The first step toward achieving this objective is to heat the two initially formed layers in the absence of a reactive atmosphere to a temperature at which oxygen migration can occur. Heating is best accomplished in a vacuum or in an inert gas atmosphere, such as an argon atmosphere. The objective is to drive oxygen out of the silica layer into the Group 4 heavy metal layer. This forms Group 4 heavy metal oxides in the Group 4 heavy metal layer at a location remote from the underlying silica layer. At the same time the Group 4 heavy metal reacts with the silica layer at its interface to form Group 4 heavy metal silicides.

The result is to form a barrier layer triad comprised of a first triad layer consisting essentially of silica, a third triad layer consisting essentially of at least one Group 4 heavy metal oxide, and a second triad layer of the barrier triad interposed between the first and second triad layers consisting essentially of at least one Group 4 heavy metal silicide.

The time and temperature of heating required to produce the necessary oxygen migration are interrelated. Oxygen migration can be achieved at lower temperatures and longer heating times or at higher temperatures and shorter heating times. Generally temperatures of at least 700° C. are required to produce significant oxygen migration, even when heating times are extended for 2 or more hours. On the other hand, it is not generally contemplated to employ heating temperatures in excess of about 1200° C. It is preferred to employ heating temperatures in the range of from about 750° C. to 1000° C., with optimum heating times being in the range of from about 800° C. to 900° C. While adequate oxygen migration can occur by rapid thermal annealing at near maximum temperatures in time periods as low as about 1 minute, generally preferred heating times are from about 30 to 60 minutes.

Although the second triad layer as initially formed of Group 4 heavy silicide, this layer in the final conductive element is a mixture of silica and Group 4 heavy metal oxide. This transformation results from subsequent heating in the presence of oxygen. This can be achieved by a separate heating step similar to that described above, but with oxygen being present. However, in most instances no additional heating step is introduced to convert the second triad layer from a silicide layer to an oxide layer, since this is achieved by heating steps to be subsequently described employed in creating at conductive crystalline rare earth alkaline earth copper oxide layer.

From the foregoing description it can be appreciated that the silicon substrate and the barrier layer triad together from the following sequence:

| |
|---|
| Third Triad Layer |
| Second Triad Layer |
| First Triad Layer |
| Silicon Substrate |

In completed conductive elements of this invention the first triad layer has a thickness of at least about 1000 Å. The maximum thickness of this layer is not critical and can range above 1 μm, if desired. The second and third barrier triad layers also each preferably have thicknesses of at least about 1000 Å, but typically each have thickness of 5000 Å or less.

Formation of the conductive rare earth akaline earth copper oxide layer can be undertaken directly on the third triad layer, if desired. It is preferred, however, first to deposit silver on the third triad layer. The silver deposit has the unexpected an advantageous effect of improving the conductive properties of rare earth alkaline earth copper oxide layers in the the $R_1A_2C_3$ crystalline form, described below. The silver facilitates formation of the desired crystal structure in the overlying conductive layer and further acts the orient the crystals in the overlying conductive layer to permit higher current densities of the rare earth alkaline earth copper oxide layers at superconducting temperatures.

The silver can be deposited by any convenient conventional technique. The silver is preferably deposited by techniques, such as vacuum vapor deeposition, metal organic compound decomposition, chemical vapor deposition, or sputtering. The silver as initially deposited preferably is provided in a layer thickness of from about 500 to 2000 Å. Microscopic examination of silver in the completed conductive elements reveals the silver to be present as a crystalline layer, which for low silver converages can be discontinuous. Thus, in the final device it is not the layer thickness that is important, but rather the presence of sufficient silver to orient crystal growth of the rare earth alkaline earth copper oxide layer. Silver coverages are adequate for this purpose that provide at least 50 micrograms ($\mu g$) of silver per square centimeter, preferably 50 to 200 $\mu g/cm^2$. The maximum silver coverage is not critical and is limited only by convenience and economic considerations.

The term "rare earth alkaline earth copper oxide" refers to a composition of matter containing at least one rare earth element, at least one alkaline earth element, copper, and oxygen. The term "rare earth" is employed to designate yttrium and lanthanides—i.e., elements of the lanthanide series. Lanthanum, samarium, europium, gadolinium, dysprosium, holmium, erbium, and ytterbium are particularly preferred lanthanides. The term "alkaline earth" indicates elements of Group 2 of the periodic table of elements as adopted by the American Chemical Society. Calcium, strontium and barium are preferred alkaline earth element for the practice of this invention.

In keeping with the established practice in the ceramics art of shortening lengthy chemcial names of mixed metal oxides by substituting acronyms based on the first letters of the metals present, the term "RAC" is hereinafter employed to indicate generically rare earth alkaline earth copper oxides. When it is intended to designate specifically a lanthanide or yttrium as the rare component, L or Y, respectively, is substituted for R; and when it is intended to designate specifically strontium or barium as the alkaline earth component, S or B, respectively, is substituted for A.

Figure 1:
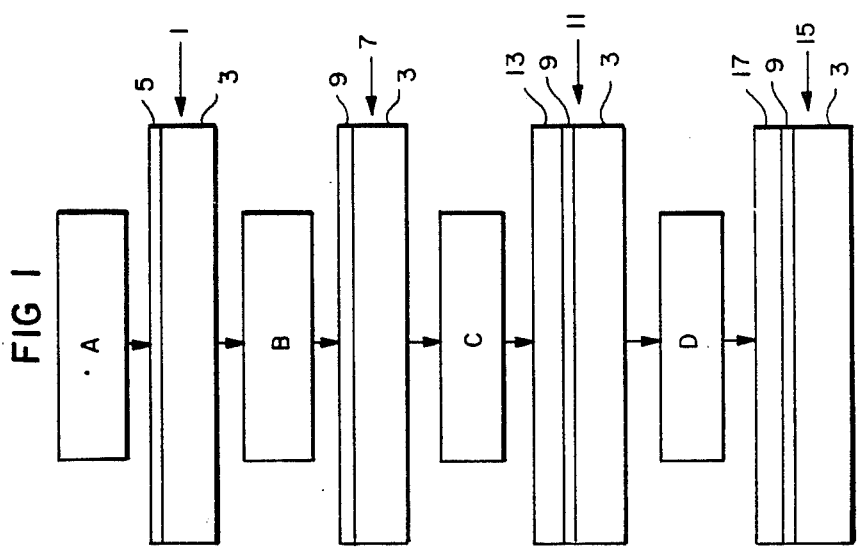
FIG. 1 is a schematic diagram showing process steps and articles produced thereby.

A preferred process for preparing an electrical circuit element according to the present invention is shematically illustrated in FIG. 1. Step A collects together the steps described above for forming the barrier layer triad, either with a silicide or a mixed metal oxide in the second layer. The resulting coated article as schematically shown consists of silicon substrate 3 and barrier layer triad 5.

In Step B the optional, but highly preferred additional step of depositing silver is performed. The barrier clad substrate 7 resulting consists of silicon substrate 3 and the barrier layer triad and silver layer, schematically illustrated as composite barrier layer 9.

In Step C of the prepartion process, onto the composite barrier layer is coated a composition consisting essentially of RAC precursors (metal-ligand compounds of each of rare earth, alkaline earth, and copper) containing at least one thermally voltilizable ligand. The resulting coated article 11 as schematically shown consists of the substrate 3, composite barrier layer 9, and a layer 13 formed of RAC precursors.

In Step D of the preparation process, the RAC precursor layer is converted into an electrically conductive crystalline RAC layer. Step D entails one or more heating steps in which volatilizabe ligands contained within the RAC precursor are removed from the layer 13, oxidation of the rare earth, alkaline earth, and copper metals occurs, and crystallization of the resulting RAC layer occurs. As schematically shown, product circuit element 15 consists of the substrate 3, composite barrier layer 9, and conductive RAC layer 17. Depending upon specific choices of materials and preparation techniques, the article 17 can exhibit a high superconducting transition temperature, herein employed to designate a $T_c$ of greater than 30° C.

A preferred process for preparing thin ($<5$ $\mu m$) film circuit elements according to this invention once a substrate having a composite barrier layer has been produced can be appreciated by reference to FIG. 2. In Step C1 of the preparation process, onto a composite barrier clad substrate is coated a solution consisting essentially of a volatilizable film forming solvent and metal-ligand compounds of each of rare earth, alkaline earth, and copper containing at least one thermally voltilizable ligand. The resulting coated article 11a as schematically shown consists of barrier clad substrate 7 and a layer 13a formed by RAC precursors (metal-ligand compounds) and film forming solvent.

In Step D1 article 11a is heated to a temperature sufficient to volatilize the ligands and the film forming solvent. The element 15a resulting consists of barrier clad substrate 7 and amorphous RAC layer 17a. In its amorphous form the RAC coating exhibits relatively low levels of electrical conductivity.

To convert the amorphous RAC layer to a more highly conductive form it is necessary to induce crystallization of the RAC layer. In Step D2 the article 15a is heated to a temperature sufficient to convert the amorphour RAC layer to a more electrically conductive crystalline form. In article 15b the RAC layer 17b on barrier clad substrate 7 is crystalline.

Crystallization of the RAC layer occurs in two stages—crystal nucleation and crystal growth. It is in some instances preferred to achieve crystal nucleation at a somewhat different temperature than is employed for crystal growth. Microscopic examination of articles at an early stage of crystallization reveals crystal nuclei surrounded by at least one other RAC phase. Further heating of the RAC layer at the temperature of nucleation or, preferably, at a somewhat higher temperature increases the size of the crystal nuclei at the expense of the surrounding RAC phase or phases until facets of adjacent crystals are grown into electrically conductive juxtaposition.

According to accepted percolation theory, for a layer consisting of conducting spheres randomly located in a surrounding nonconducting medium the spheres must account for at least 45 percent by volume of the layer for satisfactory electrical conductivity to be realized. If conducting particles of other geometric forms, particularly elongated forms, are substituted for the spheres, the conducting particles can account for less of the layer volume while still realizing satisfactory layer electrically conductivity. Similarly, electrical conductivity can be realized with a lesser proportion of conducting particles when the surrounding medium is also conductive. Thus, all layers containing at least 45 percent by volume electrically conductive particles are by theory electrically conductive.

Although satisfactory electrical conductivity can be realized with a lesser volume of the crystalline phase, it is generally contemplated that in the crystallized RAC layer the crystalline phase will account for at least 45 percent by volume and preferably 70 percent by volume of the total RAC layer. From microscopic examination of highly crystalline RAC layers exhibiting high levels of electrical conductivity it has been observed that layers can be formed in which little, if any, of the RAC phase surrounding the crystal nuclei remains. In other words greater than 90 percent (and in many instances greater than 99 percent) by volume of the RAC layer is accounted for by the desired crystalline phase.

To achieve crystallization the RAC layer can be heated to any convenient temperature level. While the composite barrier allows heating to higher crystallization temperatures than would otherwise be acceptable, it is generally preferred that the RAC layer be heated no higher than is required for satisfactory crystallization. Heating to achieve crystallization can, for example, but limited to temperatures below the melting point of the RAC composition forming the layer. From microscopic examination of RAC layers optimum heating times can be selected for maximizing both the proportion of the RAC layer accounted for by the crystalline phase and the desired configuration of the crystals produced, thereby maximizing electrical conductivity.

Step D3 entails controlled cooling of the RAC layer form its crystallization temperature. By slowing the rate of cooling of the crystalline RAC layer imperfections in the crystal lattices can be reduced and electrical conductivity, which is favored with increasing order in the crystal structure, is increased. Cooling rates of 25° C. per minute or less are contemplated until the crystalline RAC layer reaches a temperature of at least 500° C. or, preferably, 200° C. Below these temperatures the lattice is sufficiently rigid that the desired crystal structure is well established. The article 15c produced is formed of the annealed crystalline RAC layer 17c on barrier clad substrate 7.

While the article 15c exhibits high level of electrical conductivity, in some instances further heating of the article 15c in an oxygen enriched atmosphere has been observed to increase electrical conductivity further. In addition to oxygen supplied from the ligands the oxygen forming the crystalline RAC layer is obtained from the ambient atmosphere, typically air. It is believed that in some instances, depending upon the crystals structure being produced, ambient air does not provide the proportion of oxygen needed to satisfy entirely the available crystal lattice sites.

Therefore, optional Step D4 entails heating the article 15c in an oxygen enriched atmosphere, preferably pure oxygen. The object is to equilibrate the RAC crystalline layer with the oxygen enriched atmosphere, thereby introducing sufficient oxygen into the crystal lattice structure. Temperatures for oxygen enrichment of the crystalline RAC layer are above the minimum 200° C. annealing temperatures employed in Step D3 described above. To be effective in introducing oxygen into the crystal lattice temperatures above those at which the lattice becomes rigid are necessary. The duration and temperature of heating are interrelated, with higher temperatures allowing shorter oxygen enrichment times to be employed.

In preparing RAC layers shown to be benefitted by oxygen enrichment of the ambient atmosphere Step D4 can be consolidated with either or both of Steps D2 and D3. Oxygen enrichment is particularly compatible with Step D3, allowing annealing out of crystal lattice defects and correction of crystal lattice oxygen deficiencies to proceed concurrently.

The final electrically conductive article 15d is comprised of a crystalline, electrically conductive RAC layer 17d on barrier clad substrate 7.

The process described for preparing electrically conductive articles having RAC layers offers several distinct advantages. One of the most significant advantages is that the electrically conductive RAC layer is protected from direct contact with the substrate throughout the process. This allows, but does not require, higher temperatures to be employed in producing the conductive RAC layer. Further, thinner RAC layers having acceptable electrical conduction properties can be realized. In many instances the presence of th composite barrier allows superconductive and particularly high transition temperature superconductive RAC layer characteristics to be obtained which would be difficult or impossible to realize in the absence of the composite barrier.

Another significant advantage of the process described above is that the proportions of rare earth alkaline earth, and copper elements in the final RAC layer 17d exactly correspond to those present in the RAC precursor layer 13a. In other words, the final proportion of rare earth, alkaline earth, and copper elements is determined merely by mixing in the desired porportions in the film forming solvent the metal-ligand compounds employed as starting materials. This avoids what can be tedious and extended trial and error adjustments of porportions required by commonly employed metal oxide deposition techniques, such as sputtering and vacuum vapor deposition. Further, the present process does not require any reduction of atmospheric pressures, and thus no equipment for producing either high or low vacuum.

A further significant advantage of the process of this invention is that it can be applied to the fabrication of electrically conductive articles of varied geometry, particularly those geometrical forms most commonly encountered in silicon semiconductor devices, including discrete devices, hybrid circuit devices, and integrated circuit devices. In such circuit limited, if any, flexibility of the electrical conductor is required, but an ability to define areally—i.e., pattern, the electrical conductor with a high degree of precision is in many instances of the utomost importance. The present invention is compatible with precise patterning of the electrical conductor on a substrate surface.

Figure 3:
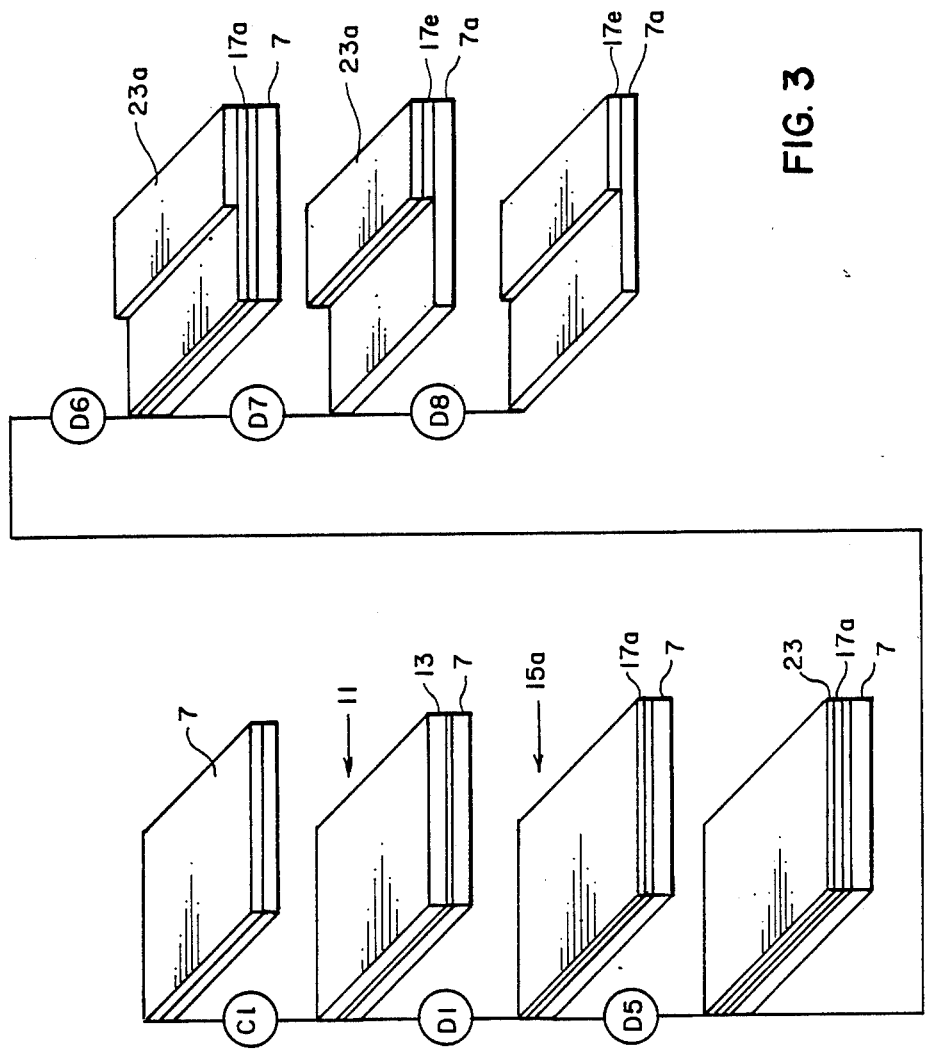
FIG. 3 is a schematic diagram of a pattern producting sequence of process steps.

Patterning of an electrical conductor according to this invention is illustrated by reference to FIG. 3. Barrier clad substrate 7 is coated on its upper planar surface with an uniform RAC precursor layer 13a as described above in connection with process Step C1 to form initial coated article 11a. Process Step D1, described above, is performed on article 11a to produce article 15a, described above, comprised of amorphous RAC layer 17a and barrier clad substrate 7.

The amorphour RAC layer lends itself to precise pattern definition and produces results generally superior to those achieved by patterning the RAC precursor layer from which it is formed or the crystalline RAC laye which is produced by further processing. The RAC precursor layer is often liquid before performing process Step D1 and is in all instances softer and more easily damaged in handling than the amorphous RAC layer. The crystalline RAC layer cannot be etched with the same boundary precision as the amorphous RAC layer, since etch rates vary from point to point based on local variations in the crystal faces and boundaries presented to the etchant. Patterning of either the RAC precursor layer or the crystalline RAC layer is specifically recognized as a viable alternative to patterning the amorphous RAC layer for applications permitting more tolerance of conductor dimensions. For example, screen printing the RAC precursor layer on a substrate to form a printed circuit is spechically contemplated.

While the amorphous RAC layer can be patterned employing any conventional approach for patterning metal oxides, for more precise edge definitions the preferred approach is to photopattern the amorphous RAC layer employing any of the photoresist compositions conventionally employed for the precise definition of printed circuit or integrated circuit conductive layers. In a preferred form of the process, a uniform photoresist layer 23 is applied to the amorphous RAC layer 17a as indicated by process Step D5. The photoresist layer can be formed by applying a liquid photoresist composition to the amorphous RAC layer, spinning th substrate to insure uniformity of the coating, and drying the photoresist. Another approach is to laminate a preformed photoresist layer supported on a transparent film to the amorphous RAC layer.

The photoresist layer is then imagewise exposed to radiation, usually through a mask. The photoresist can then be removed selectively as a function of exposure by development. Positive working photoresists are removed on development from areas which are exposed to imaging radiation while negative working photoresists are removed only in areas which are not exposed to imaging radiation. Exposure and development are indicated by process Step D6. Following this step patterned photoresist layer 23a is left on a portion or portions of hte amorphous RAC layer 17a. Although the patterned residual photoresist layer is for convenience shown of a simple geometrical form, it is appreciated that in practice the patterned photoresist can take any of a wide variety of geometrical forms, including intricate and thin line width patterns, with line widths ranging into the sub-micrometer range.

Following patterning of the photoresist layer, portions of the RAC layer which are not protected by the photoresist can be selectively removed by etching, as indicated by process Step D7. This converts the amorphous RAC layer 17a to a patterned RAC layer 17e confined to areas corresponding to that of the photoresist. Note that in the process of etching the barrier clad substrate may be modified by removal of the composite barrier in unprotected areas to produce a modified barrier clad substrate 7a. Whether or not the unprotected composite barrier is removed will depend, of course, on the specific etchant employed. However, it is important to note that there is no requirement that the etchant be selective to the amorphous RAC layer as opposed to the barrier material.

Following patterning of the amorphous RAC layer the patterned photoresist is removed, as indicated by process Step D8. The final article, shown in FIG. 4 as consisting of the partially barrier clad substrate 7a and patterened amorphous RAC layer 17e, is then further processed as indicated in FIG. 2, picking up with process Step D2. The crystalline RAC layer formed in the final product conforms tothe patterned amorphous RAC layer.

In the process of preparing a patterned article described above it is noted that once an article is formed having an amorphous RAC layer on a substrate it can be patterned to serve any of a wide variety of circuit applications, depending upon the circuit pattern chosen. It is therefore recognized that instead of or as an alternative to offering patterned articles for sale a manufacturer can instead elect to sell articles with unpatterned amorphous RAC layers on a barrier clad substrate, with or without an unpatterned photoresist layer, to subsequent fabricators. It will often be convenient in this instance to locate a removable layer or film over the amorphous RAC layer for its protection prior to further fabrication. The subsequent fabricator can undertake the patterned exposure and further processing required to produce a finished electrical circuit element.

To crystallize a RAC layer and to perform the optional, but preferred annealing and oxygen enrichment steps both the substrate and RAC layer are heated uniformly. This can be done employing any conventional oven. In some instances, however, either to protect the substrate from rising to the peak temperatures encountered by the RAC layer or simply to avoid the investment in an oven by fabricator, it is contemplated that the RAC layer will be selectively heated. This can be accomplished by employing a radiant heat source, such as a lamp—e.g., a quartz lamp. Lamps of this type are commercially available for achieving rapid thermal annealing of various conventional layers and can be readily applied to the practice of the invention. These lamps rapidly transmit high levels of electromagnetic energy to the RAC layer, allowing it to be brought to its crystallization temperature without placing the substrate in an oven.

A diverse approach for producing patterned electrical conductors can be practiced by employing article 15a comprised of the uniform amorphous RAC layer 17a and barrier clad substrae 7 as a starting element. Instead of patterning the amorphous RAC layer followed by crystallization of the remaining portions of the layer, the amorphous RAC layer is imagewise addressed to produce crystallization selectively only in areas intended to be rendered electrically conductive. For example, by addressing the amorphous RAC layer with a laser, areas directly impinged by the laser beam can be selectively crystallized to an electrically conductive form, leaving the remaining amorphous area unaffected. To define the conductive pattern generated it is only necessary to control the path of the laser beam.

Where a manufacturer chooses to sell an article consisting of a uniform amorphous RAC layer on a barrier clad substrate, this approach to patterning can be more attractive than the uniform heating processes described above, since no oven is required to reach the temperatures typically required for cystallization. The fabricator choosing laser patterning may, in fact, require no other heating equipment. Thus, a very simply approach to forming a crystalline RAC pattern is available.

It is, of course, recognized that additonal heating for purpose of annealing of oxygen saturation can be undertaken, following lamp or laser crystallization, by heating in any desired manner. One approach is to heat at least amorphous layer 17a of the article 15a to a temperature above its minimum annealing temperature and then laser address the heated article. This facilitates annealing and oxygen enrichment without requiring heating the entire article uniformly to the significantly higher levels otherwise required for crystal nucleation and growth.

Another variation on the laser patterning approach is to follow the laser responsible for crystallization with one or more passes from a lower intensity laser beam to retard the rate of cooling and thereby enhance annealing. For example, a lasser beam can be swept across an area of th substrate surface to produce crystallization and then reduced in intensity or defocused and swept back across the same area to facilitate annealing. By defocusing the laser beam on subsequent passes over the same area the laser energy is spread over a larger area so that the maximum effective temperature levels achieved are reduced. The advantage of employing one laser for multiple passes is that alignments of laser beam paths are more easily realized. Additionally or alternatively, the rapidity with which the laser is swept across the exposed are can be adjusted to control the temperature to which it heats the RAC layer. Other laser scanning variations are, of course, possible.

Both lamp heating and laser scanning allow a broader range of substrate materials to be considered, particularly those which, though capable of withstanding ligand and solvent volatilization temperatures, are susceptible to degradation at crystallization temperatures. By choosing wavelengths in spectral regions to which the amorphous RAC layer is opaque or at least highly absorbing, direct radiant heating of the substrate can be reduced or eliminated. In this instance the bulk of the radiation is intercepted in the RAC layer before it reaches the composite barrier. The silicon substrate is also protected from direct radiant heating by the composite barrier. By proper choice of radiant energy wavelengths the composite barrier can reflect a high proportion of total radiant energy received.

To avoid coating imperfections in the thin film process described above the thickness of an amorphous RAC layer produced in a single process sequence is maintained at 1 μm or less, preferably 0.6 μm or less, and optimally 0.4 μm or less, a single process sequence being understood to constitute the steps described above for forming an amorphous RAC layer. By repeating the process sequence one or more times an amorphous RAC layer of any desired thickness can be built up.

In the process of facrication described above the formation of hte desired RAC layer begins with the formation of a RAC precursor layer. To form the precursor layer a solution of a film forming solvent, a rare earth metal compound, an alkaline earth metal compound, and a copper compound is prepared. Each of the rare earth, alkaline earth, and copper compounds consists of metal ion and one or more volatilizable ligands. By "volatilizable" it is meant that the ligand or its component elements other than oxygen can be removed from the substrate surface at temperatures below the crystallization temperature of the RAC layer. In many instances organic ligands breakdown to inorganic residues, such as carbonates, at relatively low temperatures, with higher temperature being required to remove residual carbon. A ligand oxygen atom bonded directly to a metal is often retained with the metal in the RAC layer, although other ligand oxygen atoms are generally removed. At least 95 percent of the ligands and their component atoms other than oxygen are preferably outgassed at temperatures of less than 600° C. On the other hand, to avoid loss of materials before or during initial coating of the metal-ligand compounds, it is preferred that the ligands exhibit limited, if any, volatility at ambient temperatures. Metal-ligand compounds having any significant volatility below their decomposition temperature are preferably avoided.

Metalorganic compounds, such as metal alkyls, alkoxides, $\beta$-diketone derivatives, and metal salts of organic acids—e.g., carboxylic acids, constitute preferred metal-ligand compounds for preparing RAC precursor coatings. The number of carbon atoms in the organic ligand can vary over a wide range, but is typically limited to less than 30 carbon atoms to avoid unnecessarily reducing the proportion of metal ions present. Carboxylate ligands are particularly advantageous in promoting metal-ligand solubility. While very simple organic ligands, such as oxalate and acetate ligands, can be employed in one or more metal-ligands compounds, depending upon the film forming solvent and other metal-ligand compound choices, it is generally preferred to choose organic ligands containing at least 4 carbon atoms. The reason for this is to avoid crystallization of the metal-ligand compound and to improve solubility. When heating is begun to remove the film forming solvent and ligands, the solvent usually readily evaporates at temperatures well below thos required to remove the ligands. This results in leaving the metal-ligand compounds on the substrate surface. When the ligands have few carbon atoms or, in some instances, linear carbon atom chains, crystallization of the metal-ligand compounds occurs. In extreme cases crystallization is observed at room temperatures. This works against the molecular level uniformity of rare earth, alkaline earth, and copper ions sought by solution coating. Choosing organic ligands exhibiting 4 or more carbon atoms, preferably at least 6 carbon atoms, and, preferably, ligands containing branched carbon atom chains, reduces molecular spatial symmetries sufficiently to avoid crystallization. Optimally organic ligands contain from about 6 to 20 carbon atoms.

Instead of increasing the moleculare bulk or modifying the chain configuration of organic ligands to avoid any propensity toward metalorganic compound crystalization on solvent removal, another technique which can be employed is to incorporate in the film forming the solvent a separate compound to act as a film promoting agent, such as a higher molecular weight branched chain organic compound. This can, for example, take the form a branched chain hydrocarbon or substituted hydrocarbon, such as a terpene having from about 10 to 30 carbon atoms.

The film forming solvents can be chosen from a wide range of volatilizable liquids. The primary function of the solvent is to provide a liquid phase permitting molecular level intermixing of the metalorganic compounds chosen. The liquid is also chosen for its ability to cover the substrate uniformly. Thus, an optimum film forming solvent selection is in part determined by the substrate chosen. Generally more desirable film forming properties are observed with more viscous solvents and those which more readily wet the substrate alone, or with an incorporated wetting agent, such as a surfactant, present.

It is appreciated that a wide variety of ligands, film promoting agents, and film forming solvents are available and can be collectively present in a virtually limitless array of composition choices.

Exemplary preferred organic ligands for metal organic compounds include metal 2-ethylhexanoates, naphthenates, neodecanoates, butoxides, isopropoxides, rosinates (e.g., abietates), cyclohexanebutyrates, and acetylacetonates, where the metal can be any of the rare earth, alkaline earth, or copper elements to be incorporated in the RAC layer. Exemplary preferred film forming agents include 2-ethylhexanoic acid, rosin (e.g., abietic acid), ethyl lactate, 2-ethoxyethyl acetate, and pinene. Exemplary preferred film forming solvents include toluene, 2-ethylhexanoic acid, n-butyl acetate, ethyl lactate, propanol, pinene, and mineral spirits.

As previously noted, the metal-ligand compounds are incorporated in the film forming solvent in the proportion desired in the final crystalline RAC layer. The rare earth, alkaline earth, and copper can each be reacted with the same ligand forming compound or with different ligand forming compounds. The metal-ligand compounds can be incorporated in the film forming solvent in any convenient concentration up to their saturation limit a ambient temperature. Generally a concentration is chosen which provides the desired crystalline RAC layer thickness for the process sequence. Where the geometry of the substrate permits, uniformity and thickness of the metal-ligand coating can be controlled by spinning the substrate after coating around an axis normal to the surface of the substrate which has been coated. A significant advantage of spin coating is that the thickness of the coating at the conclusion of spinning is determined by the contact angle and viscosity of the coating composition and the rate and time of spinning, all of which can be precisely controlled. Differences in the amount of the coating composition applied to the substrate are not reflected in the thickness of the final coating. Centrifugal forces generated by spinning cause excess material to be rejected peripherally from the article.

The foregoing process of coating RAC precursors in solution is particularly suited to forming thin films. The tem "thin film" is employed to indicate films having thicknesses of less than 5 $\mu$m, such films most typically having thickness of less than 1 $\mu$m. The term "thick film" is employed in its art recognized usage to indicate films having thicknesses in excess of 5 $\mu$m.

Figure 4:
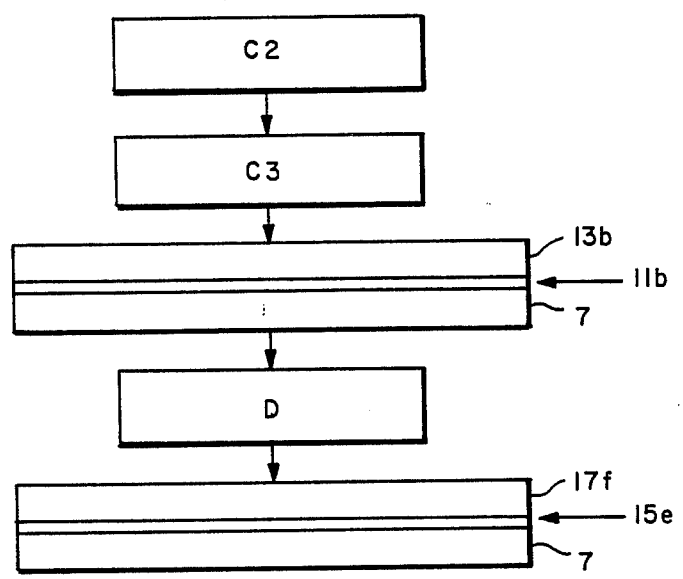
FIG. 4 is a schematic diagram of a portion of a preferred thick film process.

A preferred process for producing thick film electrically conductive RAC layers on barrier clad substrates can be appreciated by reference to the schematic diagram shown in FIG. 4. In Step C2 a composition containing particles of metal-ligand compounds is obtained. Each particle contains rare earth, alkaline earth, and copper atoms in the same ratio desired in the final RAC containing conductive layer. Further, the atoms are intimately intermixed so that the composition of each particle is preferably essentially uniform. Associated with the metal atoms and completing the compounds are voltilizable ligands, which can be all alike or chosen from among different ligands.

The particles can be of any size convenient for coating. The particles can exhibit a mean diameter up to the thickness of the coating to be formed, but more uniform films are realized when the mean particle diameters are relatively small in relation to the thickness of the film to be formed. The particles are preferably less than about 2 $\mu$m in mean diameter, optimally less than 1 $\mu$m in mean diameter. The minimum diameter of the particles is limited only by synthetic convenience.

A preferred technique for producing metal-ligand compound particles is to dissolve the rare earth, alkaline earth, and copper metal ligand compounds in a mutual solvent and then to spray the solution through an atomizing nozzle into a gaseous atmosphere. The solvent is chosen to be evaporative in the gaseous atmosphere. Thus, the individual particles are dispersed in the gaseous atmosphere as liquid particles and eventually come to rest at a collection site as either entirely solid particles or particles in which the proportion of solvent has been sufficiently reduced that each of the metal-ligand compounds present has precipitated to a solid form. In the latter instance the particles by reason of the residual solvent, now no longer acting as a solvent, but only as a continous dispersing phase, form a paste. The paste constitutes a highly convenient coating vehicle. When the particles are collected in a friable form with all or substantially all of the initially present solvent removed, it is recognized that a paste can still be formed, if desired, by adding to the particles a small amount of a liquid to promote particle cohesion—i.e., to constitute a paste.

Only a very small amount of liquid is required to promote particle cohesion and thereby form a paste. Typically the liquid constitutes less than 20 percent of the total composition weight and preferably less 15 percent of the total composition weight. While optimum paste consistencies can vary depending upon the selection of processes for coating the paste, it is generally contemplated that the paste viscosity will be in the range of from $5\times 10^4$ to $3\times 10^6$ centipoise, preferably from $1\times 10^5$ to $2.5\times 10^6$ centipoise.

While atomization and drying can be undertaken in air at room temperatures, it is recognized that any gaseous medium which does not detrimentally react with the metal-ligand compounds can be employed. Further, the temperature of the liquid forming the particles or, preferably, the gaseous medium can be increased to accelerate the solvent evaporation rate, provided only that such elevated temperatures in all instance be maintained below the thermal decomposition temperatures of the metal-ligand compounds.

The advantage of solidifying the metal-ligand compounds while they are trapped within discrete particles is that bulk separations of the rare earth, alkaline earth, and copper are prevented. The particle preparation approach offers distinct advantages over simply evaporating bulk solutions to dryness in that each particle produced by the process of this invention contains the desired ratio of rare earth, alkaline earth, and copper elements. This produces a solid particle coating composition of microscale uniformity.

In Step C3 of the preparation process, onto a substrate are coated the metal-ligand compound particles, preferably combined with a carrier liquid to form a coatable paste or slurry. The resulting coated article 11b as schematically shown consists of barrier clad substrate 7 and a layer 13b formed by RAC precursors (metal-ligand compounds) and film forming solvent. Although the layer 13b is shown coextensive with clad substrate 7, it is appreciated that the particles are well suited, particularly when coated in the form of a paste or slurry, to being laid down in any desired pattern on the barrier clad substrate. The paste can, for example, be deposited by any of a variety of conventional image defining coating techniques, such as screen or gravure printing. Since thick conductive films are most commonly formed in the art by screen printing, the present invention is highly compatible with conventional printed circuit preparation processes.

The ligands in the RAC precursor compounds of the thick film process like those of thin film process form no part of the final article and therefore can be chosen based solely upon convenience in performing the process steps described above. Ligands are chosen for their ability to form solutions in which rare earth, alkaline earth, and copper combined with the ligands are each soluble in the desired proportions and to be voltailizable during heating to form the intermediate RAC layer. Inorganic ligands, such as nitrate, sulfate, and halide ligands, are illustrative of preferred ligands satisfying the criteria set forth above. Nitrate, bromide, and chloride ligands are particularly preferred. In general the ligands are chosen so that each of the rare earth, alkaline earth, and copper ligand compounds exhibit approximately similar solubility characteristics.

Any evaporative solvent for the metal-ligand compounds can be employed for particle fabrication. Again, the solvent forms no part of the final article. Polar solvents, such as water or alcohols (e.g., methanol, ethanol, propanol, etc.), are particularly suited for use with metal-ligand compounds containing the inorganic ligands noted above.

Where a paste is coated, the paste contains either a small residual portion of the original solvent for the metal-ligand compounds or a different liquid to promote cohesion. The liquid fraction of the paste must be volatilizable. The evaporative solvents noted above all satisfy this criteria.

The paste, apart from the metal-ligand particles, can be identical in composition to conventional inks employed in screen printing. Screen printing inks normally contain an active ingredient (in this instance supplied by the metal-ligand particles), binders to promote substrate adhesion (such as glass frit or crystalline oxide powder), screening agents used to enhance the rheological properties of the ink—usually a high molecular weight polymer, such as poly(vinyl alcohol) or poly(ethylene gylcol), and a liquid, most commonly water or an alcohol. It is a particular advantage of this invention that the metal-ligand particles and liquid together provide excellent rheological and adhesion properties without necessity of incorporating other screen printing ink ingredients.

Heating step D can be performed as described above can then be undertaken to produce final article 15e consisting of thick film RAC layer 17f on barrier clad substrate 7 as described above in connection with FIG. 1. The overall heating step D can include the same sequence of steps D1, D2, D3, and D4 described above in connection with FIG. 2.

In addition to all of the advantages described above for the preferred thin film forming process, a particular advantage of thick film process is that it readily lends itself to the formation of electrical conductor patterns on limited portions of substantially planar substrate surfaces without resorting to uniform coatings followed by etching to define a pattern. This is a convenience which assumes an added level of importance in producing thick film conductors. Thus, the present process is readily applied to the fabrication of printed and hybrid circuits. The thick film process can also be employed to form RAC layers of less than 5 μm in thickness—that is, it is capable of forming either thick or thin film electrical circuit element.

To achieve articles according to this invention which are not only electrically conductive, but also exhibit high $T_c$ levels, thereby rendering them attractive for high conductivity (e.g., superconducting) electrical applications, RAC layers are produced in specfic crystalline forms. One specifically preferred class of high $T_c$ articles according to this invention are those in which the crystalline RAC layer consists of greater than 45 percent by volume of a rare earth alkaline earth copper oxide which is in a tetragonal $K_2NiF_4$ crystalline phase. The $K_2NiF_4$ crystalline phase preferably constitutes at least 70 percent and optimally at least 90 percent by volume of the RAC layer.

On rare earth alkaline earth copper oxide exhibiting this crystalline phase satisfies the metal ratio:

$$L_{2-x}:M_x:Cu \tag{I}$$

where
  L is lanthanide,
  M is alkaline earth metal, and
  x is 0.05 to 0.30.

Among the preferred lanthanides, indicated above, lanthanum has been particularly investigated and found to have desirable properties. Preferred alkaline earth metals are barium and strontium. Optimum results have been observed when x is 0.15 to 0.20.

Thus, in specifically preferred forms of the invention LBC or LSC layers exhibiting a tetragonal $K_2NiF_4$ crystalline phase are present and capable of serving high conductivity applications, including those requiring high $T_c$ levels and those requiring superconductivity at temperatures in excess of 10° K. Specific LBC layers in the tetragonal $K_2NiF_4$ crystalline phase have been observed to have $T_c$ levels in excess of 40° K.

Another specifically preferred class of high $T_c$ articles according to this invention are those in which the crystalline RAC layer consists of greater than 45 percent by volume of a rare earth alkaline earth copper oxide which an $R_1A_2C_3$ crystalline phase, believed to be an orthorhombic Pmm2 or orthorhombically distorted perovskite crystal phase. This phase preferably consititutes at least 70 percent by volume of the RAC layer.

A preferred rare earth alkaline earth copper oxide exhibiting this crystalline phase satisfies the metal ratio:

$$Y:M_2:Cu_3 \tag{II}$$

where
  M is barium, optionally in combination with one or both of strontium and calcium.

Although the $R_1A_2C_3$ crystalline phase by its crystal lattice requirements permits only a specific ratio of metals to be present, in practice differing ratios of yttrium, rare earth, and copper are permissible. The metal in excess of that required for the $R_1A_2C_3$ crystalline phase in excluded from that phase, but remains in the YAC layer.

Processing temperatures employed in forming the amorphous RAC layers in subsequently converting the amorphous layers to crystalline layers can vary significantly, depending upon the specific RAC composition and crystal form under consideration. Crystallization is in all instance achieved below the melting point to the RAC composition. Melting points for RAC compositions vary, but are typically well above 1000° C. Typical RAC crystallization temperatures are in the range of from about 900° to 1100° C. Where crystal nucleation and growth are undertaken in separate steps, nucleation is preferably undertaken at a somewhat lower temperature than crystal growth.

In some instances X-ray diffraction has revealed the presence of microcrystals in the amorphous RAC layer, although limited to minor amounts. While crystallization of the metal-ligand compounds, which tends to separate the metals into different phases, is generally avoided, crystallization which occurs during or immediately following ligand volatilization is not objectionable, since metals absent their ligands are free to form mixed metal oxides.

A preferred technique for producing a high $T_c$ coating employing an amorphous layer of the LAC composition metal ratio I above, particularly an LBC or LSC composition, is to heat to amorphous layer on the substrate to a temperature of about 925° to 975° C. to achieve crystal nucleation. Crystal growth is then undertaken at a temperature of about 975° to 1050° C. Following conversion of the LAC layer to the tetragonal $K_2NiF_4$ crystallline phase, it is cooled slowly at rate of 25° C. or less per minute until it reaches a temperature of 550° to 450° C. The LAC layer is then held at this temperature or reheated to this temperature in the presenece of an oxygen atmosphere until oxygen equilibration is substantially complete, typically about 20 to 120 minutes.

A preferred technique for producing a high $T_c$ coating employing an amorphous layer of the YAC composition satisfying metal ratio II above, particularly YBC, is to heat the amorphous layer on the substrate to a temperature of a temperature greater than 900° C., but less than 950° C., optimally 920° to 930° C. Following conversion of the LAC layer to the $R_1A_2C_3$ crystalline phase, it is cooled slowly at rate of 25° C. or less per minute until it reaches a temperature of 750° to 400° C. The YAC layer is then held at this temperature or reheated to this temperature following cooling in the presence of an oxygen atmosphere until oxygen equilibration is substantially complete, typically about 20 to 120 minutes.

EXAMPLES

Details of the preparation and performance of articles according to this invention are illustrated by the following examples:

EXAMPLE 1

A silica ($SiO_2$) layer 5000 Å thick was formed on a monocrystalline silicon substrate by thermal oxidation. A zirconium metal film 1500 Å in thickness was then evaporated on the silica layer and subsequently annealed in vacuum at 850° C. for 30 minutes to produce a barrier layer triad of the following configuration:

| |
|---|
| Zirconia |
| Zirconium Silicide |
| Silica |
| Silicon Substrate |

A high transition temperature superconductive YBC layer was deposited onto the barrier layer using the following technique:

A yyttrium containing solution was prepared by mixing and reacting yttrium acetate with a stoichiometric excess of 2-ethylhexanoic acid to produce yttrium tri(2-ethylhexanoate) in 2-ethylhexanoic acid. The resulting solution contained 7.01 percent by weight yttrium, based on total weight.

A copper containing solution was prepared by mixing and reacting copper acetate with a stoichiometric excess of 2-ethylhexanoic acid to form copper di-(2-ethylhexanoate). This solution contained 6.36 percent by weight copper, based on total weight.

A 0.81 g sample of the yttrium containing solution and a 1.92 gram sample of the copper containing solution were mixed followed by the addition of 0.66 gram of barium di(cyclohexanebutyrate), 0.4 gram of toluene, and 0.7 gram of rosin. Heat was applied until all ingredients had entered solution, thereby forming of YBC precursor solution.

The YBC precursor solution was deposited onto the composite barrier by spin coating at 5000 rpm for 20 seconds. The coated substrate had a smooth and uniform appearance with no imperfections being noted on visual inspection, indicating favorable rheological properties.

The YBC precursor coated composite barrier and silicon substrate were heated on a hot plate to 550° C. to eliminate organic ligands from the coating. The film forming process was repeated 3 times.

The amorphous RAC layer exhibited at 1:2:3 atomic ratio of Y:Ba:Cu and a thickness of about 1 $\mu$m. The amorphous YBC layer was heated to 900° C. for 3 minutes and allowed to cool at a rate of less than 25° C. per minute.

The resulting films were measured by Rutherford backscattering spectrometry (RBS), scanning electron microscopy (SEM), energy dispersive spectrometry (EDS), X-ray diffraction, and scanning Auger profiling techniques. In some instances silver contact pads were formed on the sample by painting a silver metal-organic solution and heating to about 450° C. in oxygen. Four point probe techniques were employed to measure the sheet resistance versus temperature.

RBS measurements did not reveal significant interactions between the rare earth alkaline earth copper oxide film and the silicon substrate. X-ray diffraction analysis indicated the formation of a well-defined orthorhombic peroviskite $YBa_2Cu_3O_{7-y}$ structure. Scanning Auger profiling measurements showed that the amount of silicon and zirconium in the $YBa_2Cu_3O_{7-y}$ was below the sensitivity level of the technique. It should be mentioned that these characteristics were also observed whent the thickness of the $YBa_2Cu_3O_{7-y}$ oxide film as reduced to 2500 Å. When the sheet resistance of the oxide film was measured as a function of temperature, a relatively sharp drop of the electrical resistivity was observed at temperatures of approximately 80° K.

EXAMPLES 2

A silicon substrate with a composite barrier was prepared as described in Example 1. On different samples of the barrier clad substrate were vacuum vapor deposited silver layers with thicknesses ranging from 500 to 2000 Å. A crystalline rare earth alkaline earth copper oxide coating was then formed on the silver layers similarly as described in Example 1.

The crystalline $YBa_2Cu_3O_{7-y}$ films possesed the perovskite structure with a strong orientation dependence. SEM revealed a polycrystalline structure with a grain sizes several $\mu$m in diameter. With a 500 Å silver layer the YBC oxide film showed a room temperature resistivity of about $5 \times 10^{-3}$ ohm-cm, which was about 1 order of magnitude lower than that observed with the silver layer omitted. Low temperature resistivity measurements by a 4-point probe indicated a superconducting transition at approximately 90° K. Further, superconductivity was observed to occur at higher temperatures than with the silver layer absent.

EXAMPLE 3 the procedure of Example 1 was repeated, but with the composite barrier being omitted.

It was found by RBS that copper was completely depleted from th surface crystalline oxide layer and had diffused into the silicon substrate. As a result the film showed no traces of a perovskite $R_1A_2C_3$ crystal structure. The sheet resistance of the layer was so high as to be almost unmeasurable.

The invention has been described in detail with particulare reference to preferred embodiments thereof, but it will be understood that variations and modifications can be effected within the spirit and scope of the invention.

What is claimed is:

1. A circuit element comprised of a silicon substrate and a conductive layer located on the substrate, characterized in that
   the conductive layer consists essentially of a rare earth alkaline earth copper oxide and
   a barrier layer triad is interposed between the silicon substrate and the conductive layer comprised of a first triad layer located adjacent the silicon substrate consisting essentially of silica, a third triad layer remote from the silicon substrate consisting essentially of a least one Group 4 heavy metal oxide, and a second triad layer interposed between the first and third triad layers consisting essentially of a mixture of silica and at least one Group 4 heavy metal oxide.

2. A circuit element according to claim 1 further characterized in that the conductive layer is restricted to a portion of th substrate thereby defining a conduction path on the substrate.

3. A circuit element according to claim 2 further characterized in that the barrier layer triad is restricted to the same portion of the substrate as the conductive layer.

4. A circuit element according to claim 1 further characterized in that the conductive layer exhibits a superconducting transition temperature of at least 30° K.

5. A circuit element according to claim 4 further characterized in that the conductive layer exhibits a superconducting transition temperature of at least 80° K.

6. A circuit element according to claim 1 further characterized in that the conductive layer consists of greater than 45 percent by volume of a crystalline conductive phase.

7. A circuit element according to claim 6 further characterized in that the conductive layer consists of greater than 70 percent by volume of a crystalline conductive phase.

8. A circuit element according to claim 1 further characterized in that the conductive layer is present in th form of a thin film having a thickness of less than 5 $\mu$m.

9. A circuit element according to claim 1 further characterized in that the conductive layer is present in the form of a thick film having a thickness of greater than 5 $\mu$m.

10. A circuit element according to claim 1 further characterized in that the second and third triad layers each having a thickness in the range of from 1000 to 5000 Å.

11. A circuit element according to claim 1 further characterized in that the Group 4 heavy metal is zirconium.

12. A circuit element according to claim 1 further characterized in that at least 45 percent by volume of the rare earth alkaline earth copper oxide of the conductive layer is in an $R_1A_2C_3$ crystalline phase and silver is located at the interface of the third triad layer triad and the conductive layer in an amount sufficient to direct crystal orientation of the $R_1A_2C_3$ crystalline phase.

13. A circuit element according to claim 12 further characterized in that silver is present in an amount of at least 50 micrograms per square centimeter.

14. A circuit element according to claim 13 further characterized in that silver is present in an amount of from 0 to 200 micrograms per square centimeter.

15. A circuit element according to claim 12 further characterized in that the rare earth alkaline earth copper oxide consists of yttruim as the rare earth and barium, optionally in combination with at least one of strontium and calcium, as the alkaline earth.

16. A circuit element according in claim 13 further characterized in that the metals present in the $R_1A_2C_3$ crystalline phase consist essentially of yttrium, alkaline earth, and copper in a 1:2:3 mole ratio.

17. A circuit element according to claim 16 further characterized in that the conductive layer contains at least one additional phase comprised of an oxide of at least one of rare earth, alkaline earth, and copper.

* * * * *